United States Patent
Brown et al.

(10) Patent No.: US 11,003,226 B1
(45) Date of Patent: May 11, 2021

(54) TOUCHSCREEN SENSOR ELECTROMAGNETIC INTERFERENCE PROTECTION APPARATUS

(71) Applicant: Rockwell Collins, Inc., Cedar Rapids, IA (US)

(72) Inventors: Todd M. Brown, Cedar Rapids, IA (US); Jeremy D. Iverson, Solon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/059,939

(22) Filed: Aug. 9, 2018

(51) Int. Cl.
| | |
|---|---|
| *G06F 1/18* | (2006.01) |
| *H05K 9/00* | (2006.01) |
| *G06F 3/044* | (2006.01) |
| *G06F 3/045* | (2006.01) |
| *G06F 3/047* | (2006.01) |
| *H01L 33/42* | (2010.01) |

(52) U.S. Cl.
CPC .............. *G06F 1/182* (2013.01); *G06F 3/044* (2013.01); *G06F 3/045* (2013.01); *G06F 3/047* (2013.01); *H01L 33/42* (2013.01); *H05K 9/0052* (2013.01); *H05K 9/0054* (2013.01)

(58) Field of Classification Search
CPC .... H05K 9/0052; H05K 9/0054; H01L 33/42; G06F 3/044
See application file for complete search history.

(56) References Cited

U.S. PATENT DOCUMENTS

| | | | | |
|---|---|---|---|---|
| 2012/0194998 | A1* | 8/2012 | McClure | G06F 1/1626 361/679.56 |
| 2014/0327452 | A1* | 11/2014 | Petcavich | B05D 1/18 324/658 |
| 2017/0168337 | A1* | 6/2017 | Tanaka | G06F 3/044 |
| 2017/0242502 | A1* | 8/2017 | Gray | G06F 3/0383 |
| 2017/0290210 | A1* | 10/2017 | Maeyama | H05K 9/0054 |
| 2019/0018534 | A1* | 1/2019 | Holman | G06F 3/014 |

(Continued)

OTHER PUBLICATIONS

"What is a Coupling Capacitor?," Jul. 15, 2012, Learning about Electronics, pp. 1-4 (Year: 2012).*

(Continued)

*Primary Examiner* — Amr A Awad
*Assistant Examiner* — Maheen I Javed
(74) *Attorney, Agent, or Firm* — Suiter Swantz pc llo

(57) ABSTRACT

A touchscreen display may include display chassis, a touchscreen sensor, and filters. The touchscreen sensor may include row conductors and column conductors spanning a display surface. Each of the filters may be coupled to one of the row conductors or the column conductors such that the row conductors and the column conductors are coupled to the filters. Each of the filters may be grounded to the display chassis. Each of the plurality of filters may be configured to allow a touchscreen sensor frequency band of interest to pass through said filter such that the touchscreen sensor is configured to detect touches. Each of the filters may be configured to filter out electromagnetic interference (EMI) on frequencies other than the touchscreen sensor frequency band of interest and to ground the EMI to the display chassis. The touchscreen sensor and the filters may form an EMI shield across the display surface.

14 Claims, 8 Drawing Sheets

(56) References Cited

U.S. PATENT DOCUMENTS

2019/0087042 A1\* 3/2019 Van Ostrand ....... G06F 3/04164
2019/0243504 A1\* 8/2019 Shamasundar ...... G08G 5/0047

OTHER PUBLICATIONS http://www.itoplink.com/en/html/20.html, "The Working Principle of Projected Capacitive Touch Technology", Projected Capacitive Touch, © 2015 Toplink Technology Co., Ltd., Printed Aug. 8, 2018, 2 pages.
http://www.display-solution.com/en/products/touch_screens/dmc_multi_touchscreen_en.htmlm "DMC Multi Touchscreen—analog resistive", Display Solution, DMC Co. Ltd., Copyright Display Solution AG 2018, Printed Aug. 8, 2018, 3 pages.
https://www.electronics-tutorials.ws/filter/filter_2.html, "Passive Low Pass Filter", Electronics Tutorials, Printed Aug. 8, 2018, 15 pages.
https://www.electronics-tutorials.ws/filter/filter_4.html, "Passive Band Pass Filter", Electronics Tutorials, Printed Aug. 8, 2018, 11 pages.
https://www.electronics-tutorials.ws/filter/filter_5.html, "Active Low Pass Filter", Electronics Tutorials, Printed Aug. 8, 2018, 12 pages.
https://www.electronics-tutorials.ws/filter/filter_7.html, "Active Band Pass Filter", Electronics Tutorials, Printed Aug. 8, 2018, 12 pages.
http://www.sky-technology.eu/en/displays/touch-screens/projected-capacitive-touch-screens-how-they-work.html, "Projected Capacitive Touch Screens", Skytechnology, Printed Aug. 8, 2018, 6 pages.
http://www.sky-technology.eu/en/displays/touch-screens/how-do-touchscreens-work-a-complete-touch-screen-overview.html, "How Do Touchscreens Work?", Skytechnology, Printed Aug. 8, 2018, 5 pages.
https://www.pannam.com/resistive-touch/, "Resistive Touch Screens", Touch Screen Technology, Pannam Imaging Advanced Interface Solutions, Printed Aug. 8, 2018, 6 pages.
http://touchscreensolutions.com.au/how-touch-works/, "How touch screen technology works", Touchscreen Solutions, Printed Aug. 8, 2018, 9 pages.
https://www.researchgate.net/figure/The-structure-of-capacitive-touchscreen_fig6_316064826, Cellulose composite for electronic devices, Printed Aug. 8, 2018, 1 page.
https://www.electronics-tutorials.ws/category/filter, "Filters", Electronics Tutorials, Printed Aug. 8, 2018, 8 pages.

\* cited by examiner

TOUCHSCREEN SENSOR ELECTROMAGNETIC INTERFERENCE PROTECTION APPARATUS

BACKGROUND

Electronic components within displays, such as aircraft displays, can be subject to electromagnetic interference (EMI). While the display chassis can provide EMI shielding on the sides of the display, the display surface can allow electromagnetic interference to disrupt operation of the internal electronic components if the display surface lacks an EMI shield. In systems (e.g., aircraft systems) where EMI shielding is required to meet the electromagnetic interference (EMI) requirements, a transparent conductive layer, such as an indium tin oxide (ITO) layer, is often applied across the display surface and connected to the display chassis as an EMI shield, such that the transparent conductive layer and the display chassis act as a Faraday cage. While transparent conductive layers are effective as forming an EMI shield across the display surface, transparent conductive layers, such as ITO layers, are expensive. Additionally, transparent conductive layers can reduce the accuracy of the touch sensor in touchscreen displays, such as projected capacitance touchscreens (pCap) that utilize a grid of conductors to serve as the transmitting and receiving antenna for the touchscreen sensor on a display. Further, transparent conductive layers, such as ITO layers, can reduce optical transmission through a display stack of a display.

SUMMARY

In one aspect, embodiments of the inventive concepts disclosed herein are directed to a touchscreen display. The touchscreen display may include a display chassis, a touchscreen sensor, and filters. The touchscreen sensor may include a grid of row conductors and column conductors spanning a display surface of the touchscreen display. Each of the filters may be coupled to one of the row conductors or the column conductors such that the row conductors and the column conductors are coupled to the filters. Each of the filters may be grounded to the display chassis. Each of the filters may be configured to allow a touchscreen sensor frequency band of interest to pass through said filter such that the touchscreen sensor is configured to detect touches. Each of the filters may be configured to filter out electromagnetic interference (EMI) on frequencies other than the touchscreen sensor frequency band of interest and to ground the EMI to the display chassis. The touchscreen sensor and the filters may form an EMI shield across the display surface of the touchscreen display.

In a further aspect, embodiments of the inventive concepts disclosed herein are directed to a projected capacitance touchscreen display. The projected capacitance touchscreen display may include a display chassis, a touchscreen sensor, drivers, receivers, and filters. The touchscreen sensor may include a grid of row conductors and column conductors spanning a display surface of the touchscreen display. Each intersection of the row conductors and column conductors may form a capacitor. The drivers may be coupled to each of a first set of conductors, the first set of conductors being either the row conductors or the column conductors. The drivers may be configured to drive a transmit signal through each of the first set of conductors. The receivers may be coupled to each of a second set of conductors, the second set of conductors being other than the row conductors or the column conductors coupled to the drivers. The receivers may be configured to receive a receive signal from each of the second set of conductors. Each of the filters may be coupled to one of the row conductors or the column conductors such that the row conductors and the column conductors are coupled to the filters. Each of the filters may be grounded to the display chassis. Each of the filters may be configured to allow a touchscreen sensor frequency band of interest to pass through said filter such that the touchscreen sensor is configured to detect touches. Each of the filters may be configured to filter out electromagnetic interference (EMI) on frequencies other than the touchscreen sensor frequency band of interest and to ground the EMI to the display chassis. The touchscreen sensor and the filters may form an EMI shield across the display surface of the touchscreen display.

In a further aspect, embodiments of the inventive concepts disclosed herein are directed to a resistive touchscreen display. The resistive touchscreen display may include a display chassis, a touchscreen sensor, and filters. The touchscreen sensor may include a grid of row conductors and column conductors spanning a display surface of the touchscreen display, the grid of row conductors and column conductors forming a plurality of resistive touchscreen sensor cells. Each of the filters may be coupled to one of the row conductors or the column conductors such that the row conductors and the column conductors are coupled to the filters. Each of the filters may be grounded to the display chassis. Each of the filters may be configured to allow a touchscreen sensor frequency band of interest to pass through said filter such that the touchscreen sensor is configured to detect touches. Each of the filters may be configured to filter out electromagnetic interference (EMI) on frequencies other than the touchscreen sensor frequency band of interest and to ground the EMI to the display chassis. The touchscreen sensor and the plurality of filters may form an EMI shield across the display surface of the touchscreen display.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1A:
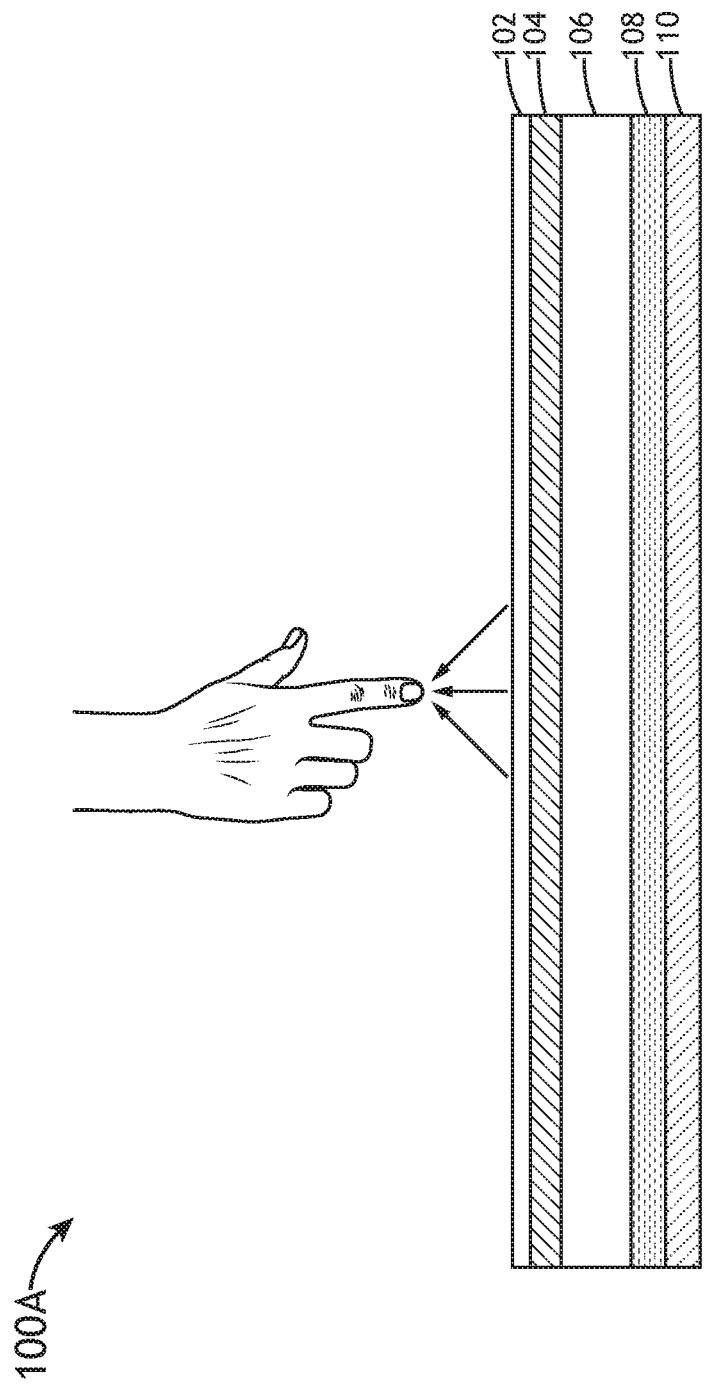
FIG. 1A is a view of an exemplary embodiment of a transmissive touchscreen display according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a touchscreen display (e.g., a projected capacitance touchscreen (pCap) display or a resistive touchscreen display) including an EMI shielding touchscreen sensor. Embodiments may include a network of filters coupled to each end of each conductor of a grid of conductors in touchscreen sensor of a touchscreen display so as to ac couple the frequencies outside of a narrow band utilized by the touchscreen controller to the grounded chassis at edges of the touchscreen display. A predetermined narrow touchscreen sensor frequency band of interest may be used for the touchscreen scan while shielding the unit from other frequencies that pose EMI threats. That is, the network of filters may allow the predetermined narrow touchscreen sensor frequency band of interest to pass through the filter to internal electronic components of the touchscreen display such that the touchscreen sensor is configured to detect touches. Additionally, each of the filters may be configured to filter out EMI on frequencies other than the touchscreen sensor frequency band of interest and to ground the EMI to the display chassis. As such, the touchscreen sensor and the filters may form an EMI shield across the display surface of the touchscreen display. The EMI shielding touchscreen sensor may be implemented as any suitable touchscreen sensor having a grid of conductors, such as a resistive touchscreen sensor or a projected capacitance touchscreen sensor. Embodiments allow an EMI shielding touchscreen sensor to eliminate the need for a transparent conductive layer (e.g., an ITO layer) to be applied across a display surface, and as such, embodiments significantly reduce the material and labor cost of a touchscreen display and improve the optical transmission through the display stack of a touchscreen display.

Figure 1B:
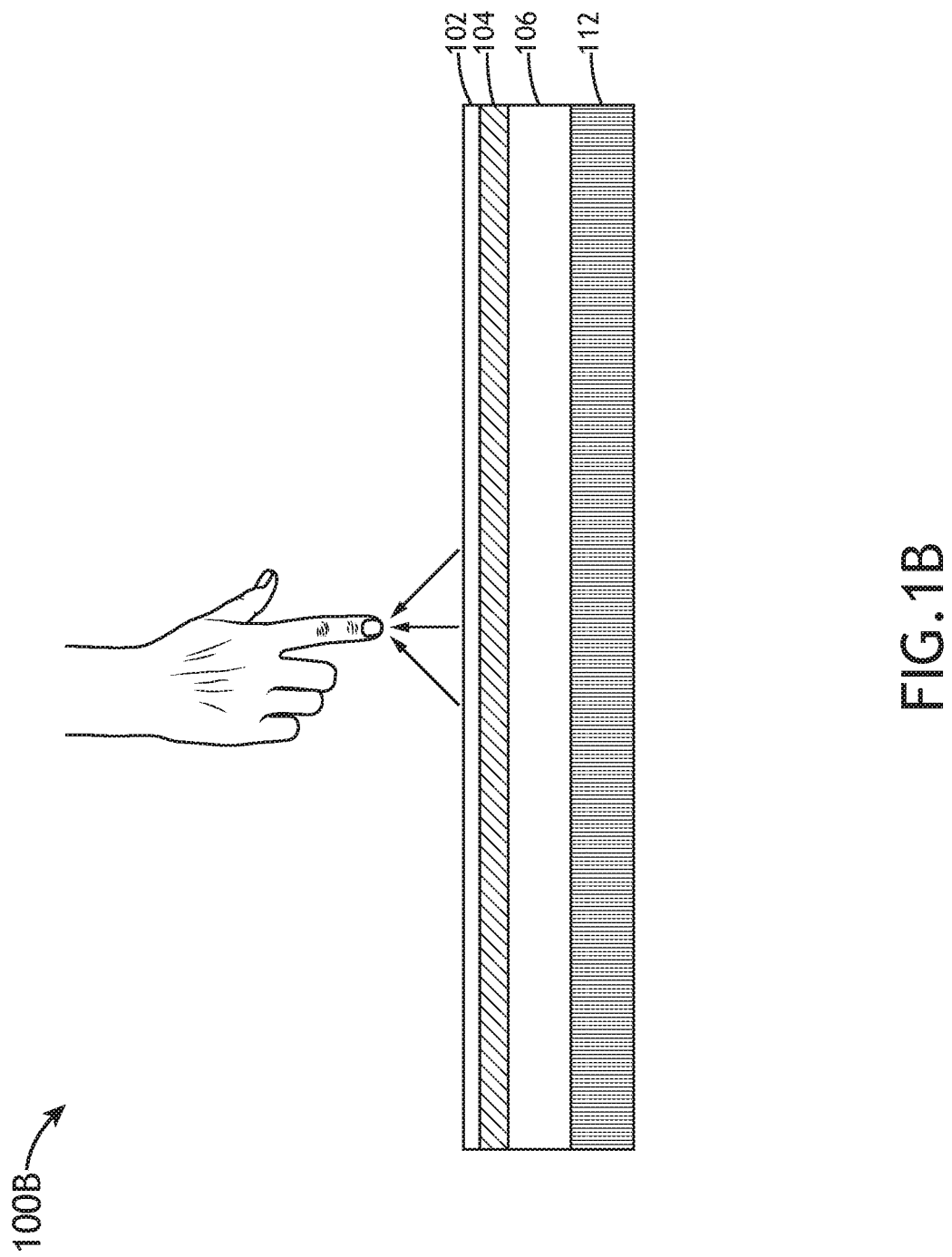
FIG. 1B is a view of an exemplary embodiment of an emissive touchscreen display according to the inventive concepts disclosed herein.

Referring now to FIGS. 1A-1B, exemplary embodiments of touchscreen displays 100 (e.g., transmissive touchscreen display 100A, emissive touchscreen display 100B) are depicted according to the inventive concepts. In some embodiments, the touchscreen displays 100 may be implemented as aircraft touchscreen displays.

Referring now to FIG. 1A, an exemplary embodiment of a transmissive touchscreen display 100A according to the inventive concepts disclosed herein includes a display stack. The display stack may include a transparent protective cover 102, a touchscreen sensor 104 (e.g., a projected capacitance touchscreen sensor or a resistive touchscreen sensor) implemented in a layer, a transparent substrate 106, a transmissive display element 108 (e.g., a liquid crystal display (LCD) element), and a backlight 110. The display stack may include additional layers or omit one or more of the depicted layers. The transmissive touchscreen display 100A may be implemented as any suitable transmissive touchscreen display, such as an LCD touchscreen display.

Referring now to FIG. 1B, an exemplary embodiment of an emissive touchscreen display 100B according to the inventive concepts disclosed herein includes a display stack. The display stack may include a transparent protective cover 102, a touchscreen sensor 104 (e.g., a projected capacitance touchscreen sensor or a resistive touchscreen sensor) implemented in a layer, a transparent substrate 106, and an emissive display element 112 (e.g., an organic light-emitting diode (OLED) display element, such as active-matrix OLEDs (AMOLEDs), passive-matrix OLEDs (PMOLEDs), or light-emitting electrochemical cells (LECs)). The display stack may include additional layers or omit one or more of the depicted layers. The emissive touchscreen display 100B may be implemented as any suitable emissive touchscreen display, such as an OLED touchscreen display, an AMOLED touchscreen display, a PMOLED touchscreen display, or an LEC touchscreen display.

Figure 2:
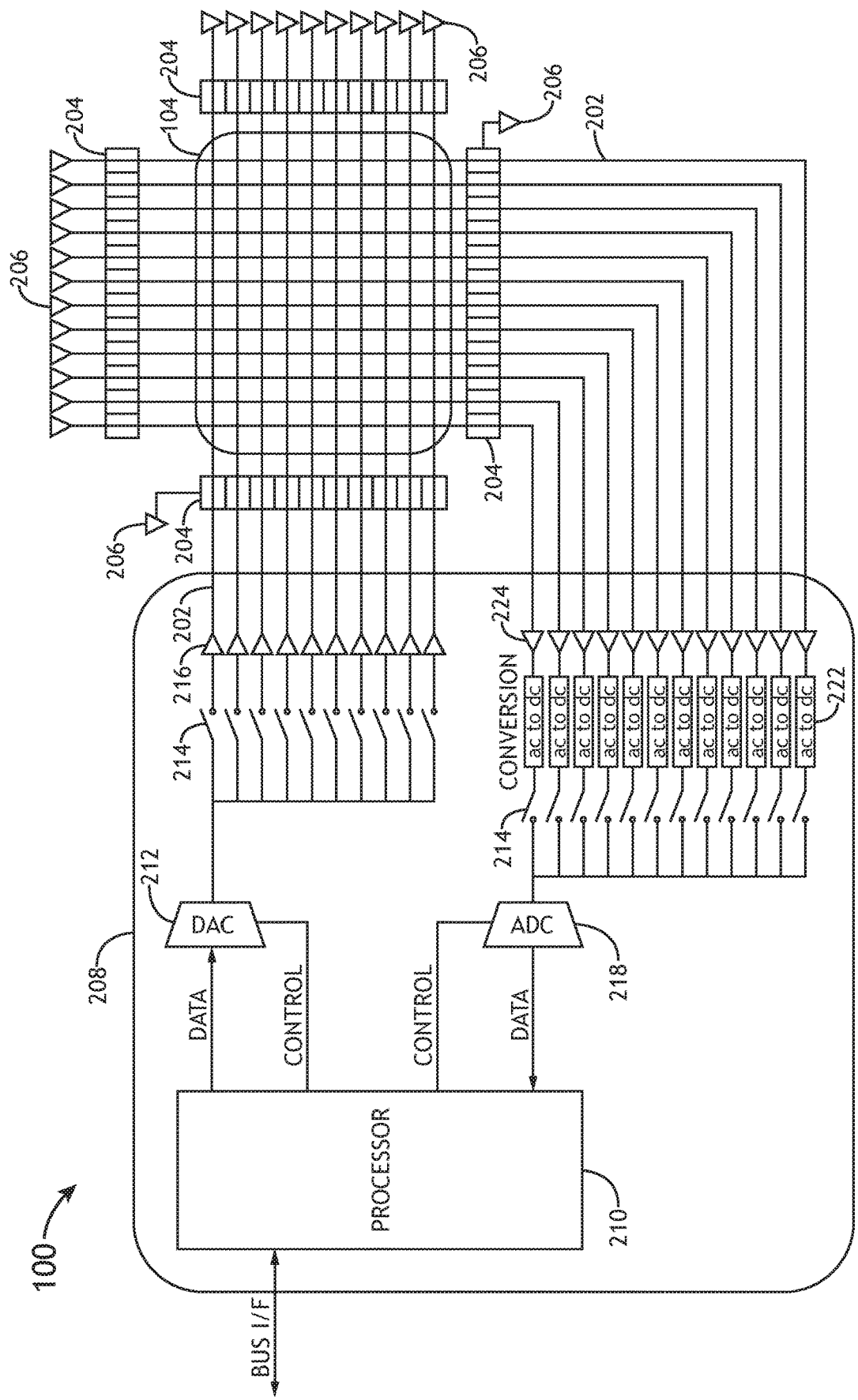
FIG. 2 is a view of an exemplary embodiment of a touchscreen display implemented as a projected capacitance touchscreen display according to the inventive concepts disclosed herein.
Figure 3:
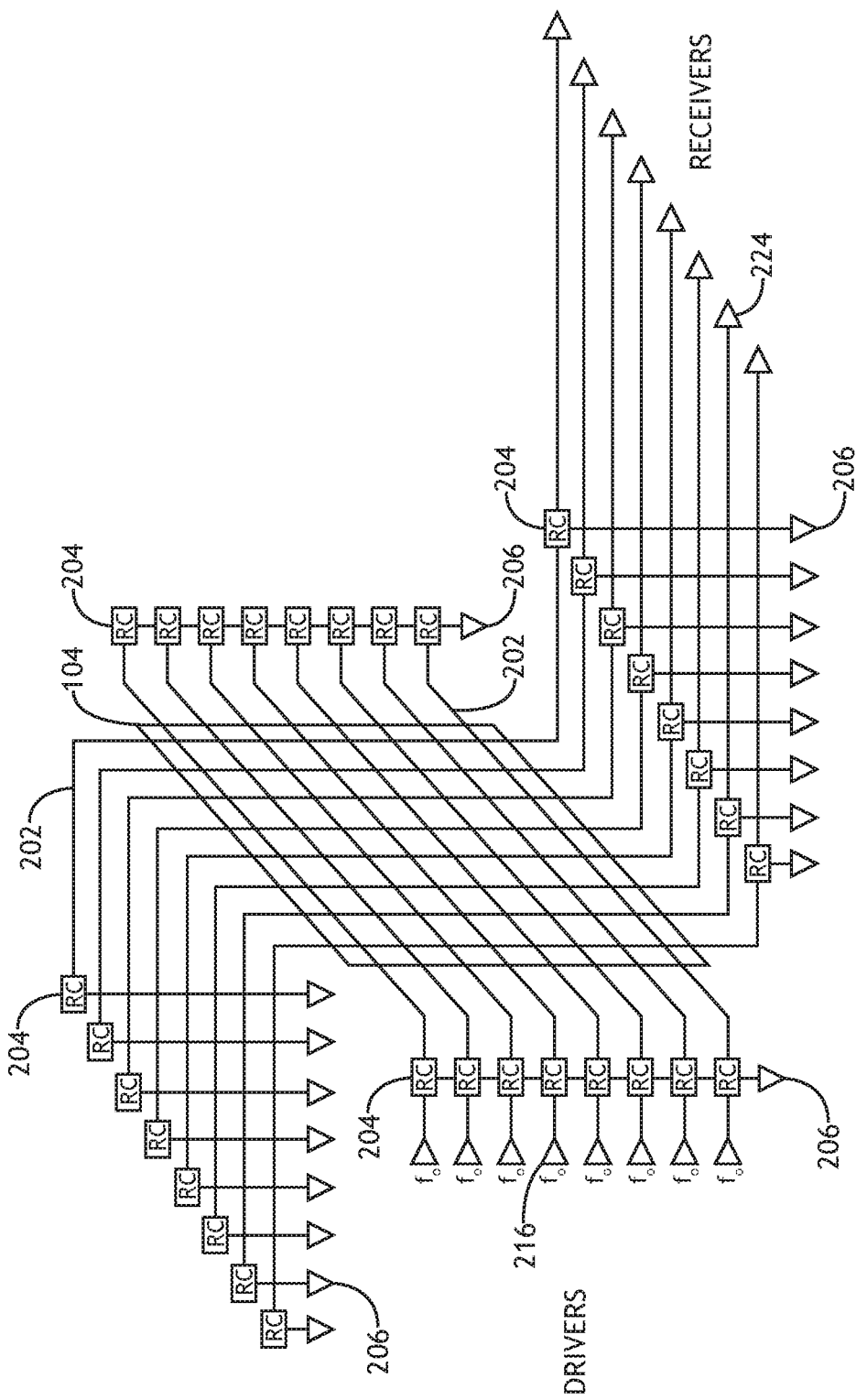
FIG. 3 is a further view of the touchscreen display implemented as a projected capacitance touchscreen display of FIG. 2 according to the inventive concepts disclosed herein.

Referring now to FIGS. 2-3, an exemplary embodiment of a touchscreen display 100 implemented as a projected capacitance touchscreen display is depicted according to the inventive concepts. As shown in FIGS. 2-3, the touchscreen display 100 may include a touchscreen sensor 104 (e.g., a projected capacitance touchscreen sensor), a network of filters 204, grounds 206, and a touchscreen controller 208, as well as other components, equipment, and/or devices commonly included in a touchscreen display, some or all of which may be communicatively coupled.

The touchscreen sensor 104 may include a grid of conductors 202 implemented in layer of a display stack of the touchscreen display 100. The grid of conductors 202 may include intersecting row conductors 202 and column conductors 202. The grid of conductors 202 may serve as transmitting and receiving antenna for the touchscreen sensor 104 of the touchscreen display 100. Each intersection of the row conductors and column conductors may form a capacitor. For example, portions (e.g., portions in the display stack) of the conductors 202 may be transparent, and for example, may be formed of ITO; additionally, for example, portions of the conductors 202 outside of the display stack may be non-transparent. The grid of conductors 202 may be electrically coupled to the filters 204 and the touchscreen controller 208.

Each filter 204 may be electrically coupled to one of the row conductors 202 or the column conductors 202 such that the row conductors 202 and the column conductors 202 are coupled to the filters 204. Each filter 204 may be grounded to the display chassis (e.g., 604) as shown by grounds 206. Each filter 204 may be configured to allow a touchscreen sensor frequency band of interest ($f_0$) to pass through said filter 204 such that the touchscreen sensor 104 is configured to detect touches. Each filter 204 may be configured to filter out EMI on frequencies other than the touchscreen sensor frequency band of interest ($f_0$) and to ground the EMI to the display chassis (e.g., 604). For example, by applying filters 204 to the grid of conductors 204, the touchscreen sensor 104 may behave as an EMI shield at all frequencies except the touchscreen sensor frequency band of interest ($f_0$) used by the touchscreen drivers 216 and the touchscreen receivers 224. In some embodiments, each filter 204 may be coupled to an end of one of the row conductors 202 or the column conductors 202 such that ends of the row conductors 202 and the column conductors 202 are coupled to the filters 204. For example, the filters 204 may be implemented along edges of the display surface of the touchscreen display 100, though the filters 204 can be located elsewhere on the touchscreen display 100. In some embodiments, each filter 204 may be implemented as a resistance capacitance (RC) filter. In some embodiments, each filter 204 may be implemented as a passive filter. In some embodiments, each filter 204 may be implemented as an active filter. In some embodiments, each filter 204 may be implemented as a band pass filter, a low pass filter, or a high pass filter.

The touchscreen controller 208 may be communicatively (e.g., electrically) coupled to the touchscreens sensor 104 (e.g., including the conductors 202) as well as to other electronic components of the touchscreen display 100 or other electronic devices. The touchscreen controller 208 may be configured to drive transmit signals (e.g., square wave signals or sine wave signals) onto row conductors 202 or column conductors 202 and to read receive signals from the other of the row conductors 202 or the column conductors 202 to determine user touch locations on the touchscreen display 100. The touchscreen controller 208 may include a processor 210, a digital to analog converter (DAC) 212, switches 214, drivers 216 (e.g., amplifiers), receivers 224 (e.g., amplifiers), conversion circuits 222 (e.g., alternating current (AC) to direct current (DC) conversion circuits), and an analog to digital converter (ADC) 218, as well other electronic components typically included in a touchscreen controller.

The processor 210 may be implemented as any suitable processor, such as a general purpose processor or a field-programmable gate array (FPGA). The processor 104 may be configured to run various software applications or computer code stored (e.g., maintained) in a non-transitory computer-readable medium (e.g., memory) and configured to execute various instructions or operations. The processor 210 may be implemented as a special purpose processor configured (e.g., programmed) to execute instructions for performing any or all of the operations disclosed throughout.

The processor 210 may be configured to control the driving of transmit signals (e.g., square wave signals or sine wave signals) onto row conductors 202 or column conductors 202 and to read receive signals from the other of the row conductors 202 or the column conductors 202 to determine user touch locations on the touchscreen display 100.

For example, the processor 210 may be configured output data transmit signals (e.g., square wave data signals or sine wave data signals) to the DAC 212. The processor 210 may be configured to control the DAC 212 so as to control the switches 214 for determining which driver 216 and coupled row or column of the conductors 202 receive a transmit signal at a given time. At a given time, one of the drivers 216 may drive a transmit signal through a coupled conductor 216. The processor may repeat this process iteratively for each set of coupled switch 214, driver 216, and conductor 202 such that a scan cycle is performed across all row conductors 202 or column conductors 202. Multiple scan cycles may be repeated so as to determine where a user touch is located over time. When a user touches the touchscreen display 100 part of the transmit signal is routed into one or more orthogonal row conductors 202 or column conductors 202 as a receive signal.

A receive signal may be routed along one of the orthogonal row conductors 202 or column conductors 202 to one of the receivers 224. The receiver 224 may amplify the signal and output the signal to the conversion circuits to convert the received signal from AC to DC where the received signal may be passed through a closed switch 214 that is controlled by the processor 210 and the ADC 218. The received signal may be converted into digital form by the ADC 218 output to the processor 210. The processor 210 may then read the received signal and determine a location of a user touch. Additionally, the processor 210 may be configured to output user touch location data to other electronic components or other electronics devices via an intermediate frequency bus.

The drivers 216 may output transmit signals having a predetermined touchscreen sensor frequency band of interest, and the receivers 224 may receive signals within the predetermined touchscreen sensor frequency band of interest such that the filters 204 may allow the transmit signals and the receive signals to pass through the filters 204 so that the touchscreen sensor 104 is configured to detect touches; however, the filters 204 may be configured to filter out EMI on frequencies other than the touchscreen sensor frequency band of interest and to ground the EMI to the display chassis.

Figure 4:
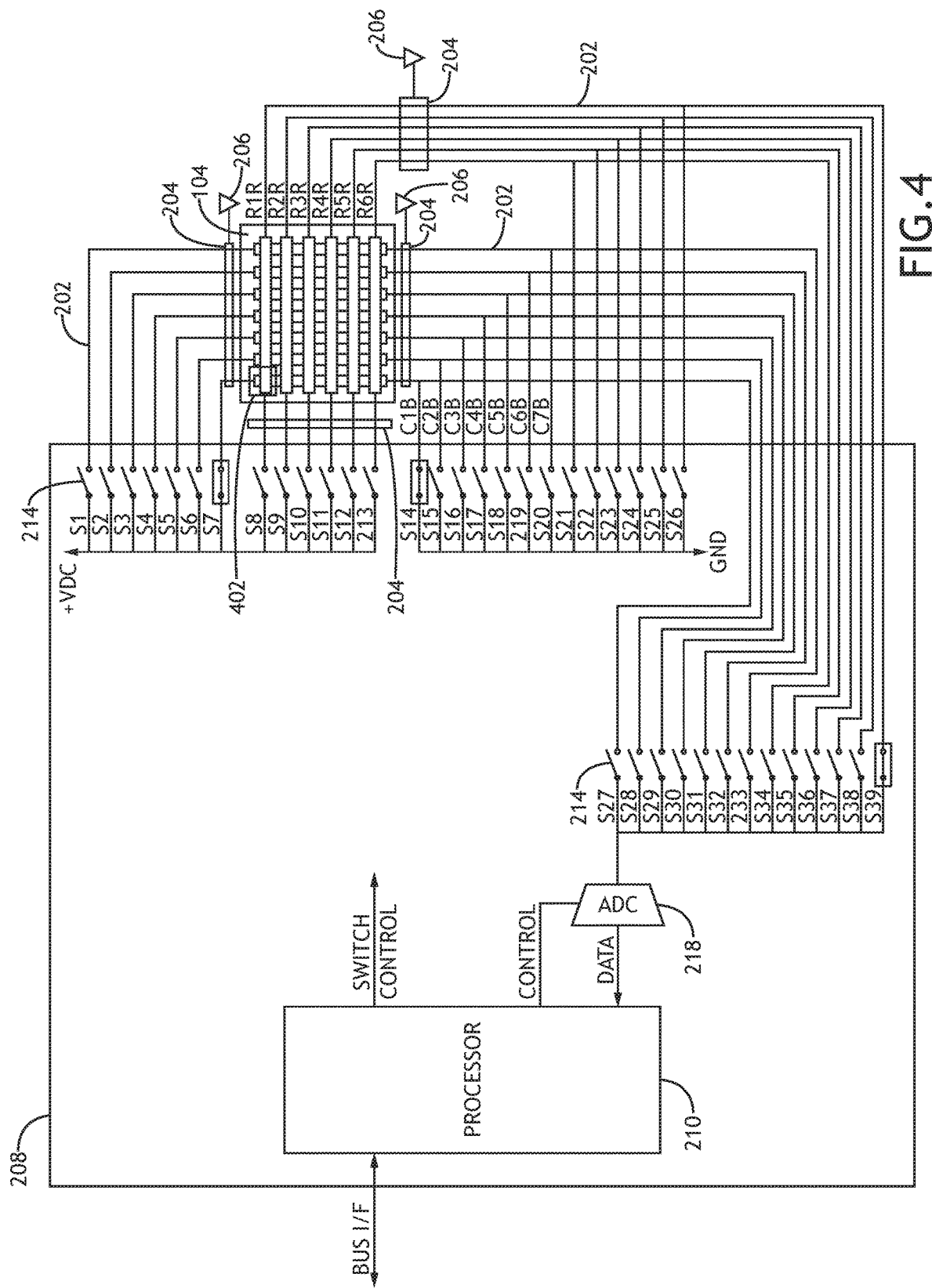
FIG. 4 is a view of an exemplary embodiment of a touchscreen display implemented as a resistive touchscreen display according to the inventive concepts disclosed herein.

Referring now to FIG. 4, an exemplary embodiment of a touchscreen display 100 implemented as a resistive touchscreen display is depicted according to the inventive concepts. As shown in FIG. 4, the touchscreen display 100 may include a touchscreen sensor 104 (e.g., a resistive touchscreen sensor), a network of filters 204, grounds 206, and touchscreen controller 208, as well as other components, equipment, and/or devices commonly included in a touchscreen display, some or all of which may be communicatively coupled.

The touchscreen sensor 104 may include a grid of conductors 202 implemented in layer of a display stack of the touchscreen display 100. The grid of conductors 202 may include intersecting row conductors 202 and column conductors 202 that form resistive touchscreen sensor cells 402. The grid of conductors 202 may be implemented as including any number of row conductors 202 and any number of column conductors 202, such as 1 by 1 or m by n. Each of the resistive touchscreen sensor cells 402 may be implemented as a four-wire resistive touchscreen sensor cell. For example, portions (e.g., portions in the display stack) of the conductors 202 may be transparent, and for example, may be formed of ITO; additionally, for example, portions of the conductors 202 outside of the display stack may be non-transparent. The grid of conductors 202 may be electrically coupled to the filters 204 and the touchscreen controller 208.

Each filter 204 may be electrically coupled to one of the row conductors 202 or the column conductors 202 such that the row conductors 202 and the column conductors 202 are coupled to the filters 204. Each filter 204 may be grounded to the display chassis (e.g., 604) as shown by grounds 206. Each filter 204 may be configured to allow a touchscreen sensor frequency band of interest ($f_o$) to pass through said filter 204 such that the touchscreen sensor 104 is configured to detect touches. Each filter 204 may be configured to filter out EMI on frequencies other than the touchscreen sensor frequency band of interest ($f_o$) and to ground the EMI to the display chassis (e.g., 604). For example, for a resistive touchscreen, the touchscreen sensor frequency band of interest ($f_o$) may be effectively DC. For example, by applying filters 204 to the grid of conductors 204, the touchscreen sensor 104 may behave as an EMI shield at all frequencies except the touchscreen sensor frequency band of interest ($f_o$) used by the touchscreen sensor 104. In some embodiments, each filter 204 may be coupled to an end of one of the row conductors 202 or the column conductors 202 such that ends of the row conductors 202 and the column conductors 202 are coupled to the filters 204. For example, the filters 204 may be implemented along edges of the display surface of the touchscreen display 100, though the filters 204 can be located elsewhere on the touchscreen display 100. In some embodiments, each filter 204 may be implemented as a resistance capacitance (RC) filter. In some embodiments, each filter 204 may be implemented as a passive filter. In some embodiments, each filter 204 may be implemented as an active filter. In some embodiments, each filter 204 may be implemented as a band pass filter, a low pass filter, or a high pass filter.

The touchscreen controller 208 may be communicatively (e.g., electrically) coupled to the touchscreens sensor 104 (e.g., including the conductors 202) as well as to other electronic components of the touchscreen display 100 or other electronic devices. For example, for each of the resistive touchscreen sensor cells 402, the touchscreen controller 208 may be configured to apply a positive voltage direct current (+VDC) (e.g., by closing a switch 214 (e.g., S7)) to a first side (e.g., a top at column 1 top (C1T)) of the resistive touchscreen sensor cell 402 and to apply (e.g., by closing a switch 214 (e.g., S14)) a ground to a second side (e.g., a bottom at column 1 bottom (C1B)) of the resistive touchscreen sensor cell 402. The touchscreen controller 208 may then read a voltage via row conductor 202 (e.g., R1R) and a switch 214 (e.g., S39) to determine a vertical touch point within the resistive touchscreen sensor cell 402. Similarly, the touchscreen controller 208 can determine a horizontal touch point within the resistive touchscreen sensor cell 402 by applying a positive voltage direct current to a third side (e.g., a left side) of the resistive touchscreen sensor cell 402 and to apply a ground to a fourth side (e.g., a right side) of the resistive touchscreen sensor cell 402 and reading a voltage to determine a horizontal touch point within the resistive touchscreen sensor cell 402. The touchscreen controller 208 may iteratively perform a scan over all of the resistive touchscreen sensor cells 402 to determine multiple touch points on the touchscreen display 100. The touchscreen controller 208 may include a processor 210, switches 214, and an analog to digital converter (ADC) 218, as well other electronic components typically included in a touchscreen controller.

The processor 210 may be implemented as any suitable processor, such as a general purpose processor or a field-programmable gate array (FPGA). The processor 210 may be configured to run various software applications or computer code stored (e.g., maintained) in a non-transitory computer-readable medium (e.g., memory) and configured to execute various instructions or operations. The processor 210 may be implemented as a special purpose processor configured (e.g., programmed) to execute instructions for performing any or all of the operations disclosed throughout.

The processor 210 may be configured to control the application of voltages and grounds onto row conductors 202 or column conductors 202 and to read voltages from other of the row conductors 202 or the column conductors 202 to determine user touch locations on the touchscreen display 100.

The resistive touchscreen sensor cells 402 of the touchscreen sensor 104 may operate within a predetermined touchscreen sensor frequency band of interest such that the filters 204 may allow signals to pass through the filters 204 so that the touchscreen sensor is configured to detect touches; however, the filters 204 may be configured to filter out EMI on frequencies other than the touchscreen sensor frequency band of interest and to ground the EMI to the display chassis.

Figure 5:
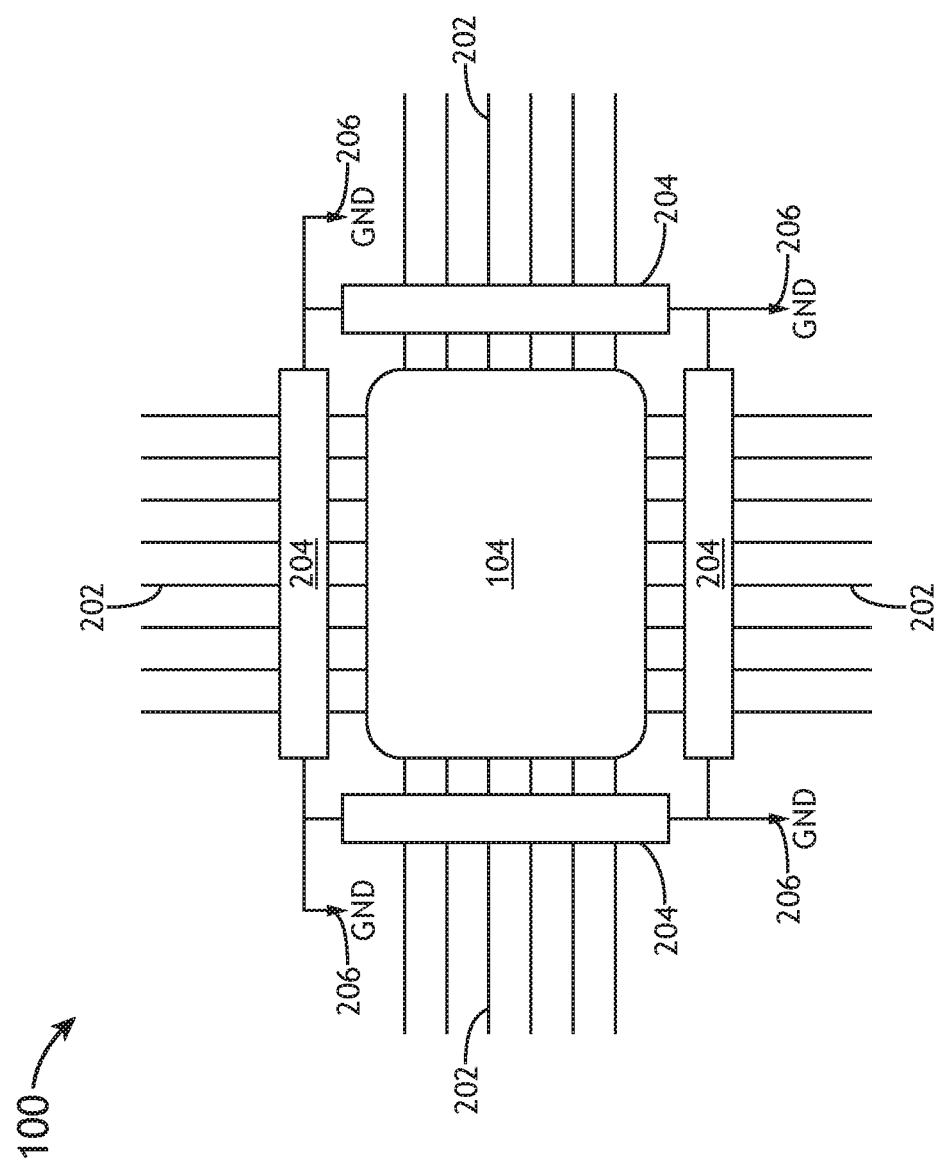
FIG. 5 is a view of an exemplary embodiment of a touchscreen display according to the inventive concepts disclosed herein.
Figure 6:
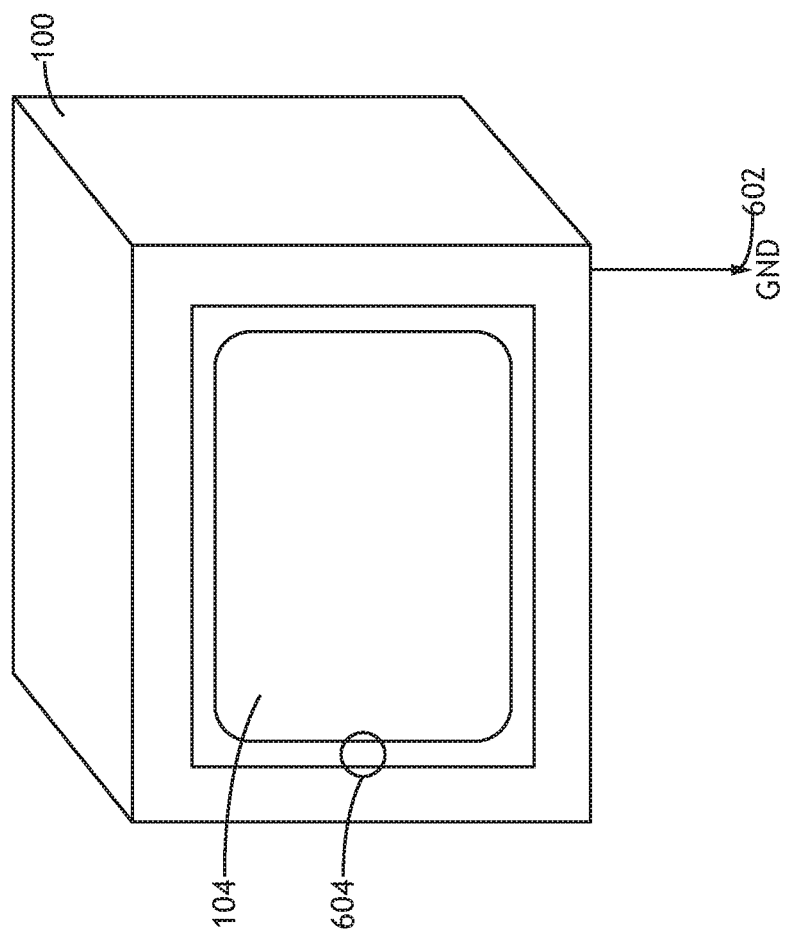
FIG. 6 is a view of an exemplary embodiment of a touchscreen display according to the inventive concepts disclosed herein.

Referring now to FIGS. 5-6, an exemplary embodiment of a touchscreen display 100 is depicted according to the inventive concepts. As shown in FIG. 5, the network of filters 204 may be coupled to the row conductors 202 and column conductors 202 of the touchscreen sensor 104. The network of filters 204 may be positioned near edges of the touchscreen sensor 104. Each of the filters 204 may be grounded to the display chassis 604 via grounds 206. The touchscreen display 100 may also be grounded (e.g., to an aircraft) via ground 602.

Figure 7:
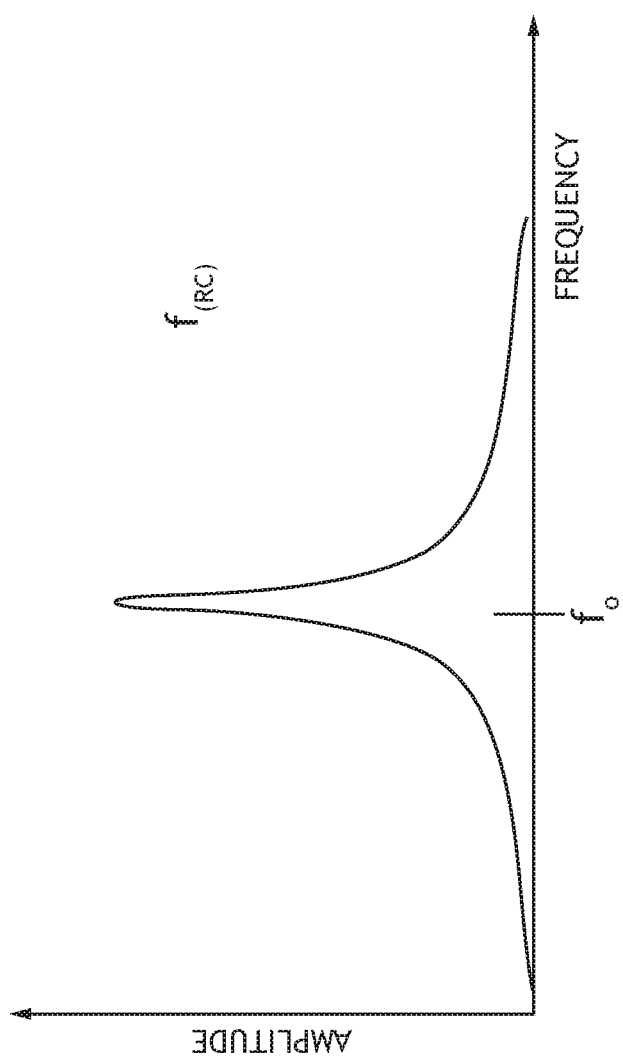
FIG. 7 is an exemplary frequency-amplitude graph of a filter implemented as a band pass filter according to the inventive concepts disclosed herein.

Referring now to FIG. 7, an exemplary frequency-amplitude graph of a filter 204 implemented as a band pass filter is depicted according to the inventive concepts. While in one embodiment the filters may be implemented as band pass filters, in some embodiments the filters 204 may be implemented as any suitable filters such as described throughout.

As will be appreciated from the above, embodiments of the inventive concepts disclosed herein may be directed to a touchscreen display including an EMI shielding touchscreen sensor.

As used throughout and as would be appreciated by those skilled in the art, "at least one non-transitory computer-readable medium" may refer to as at least one non-transitory computer-readable medium (e.g., memory, storage, or a combination thereof; e.g., at least one computer-readable medium implemented as hardware; e.g., at least one non-transitory processor-readable medium, at least one memory (e.g., at least one nonvolatile memory, at least one volatile memory, or a combination thereof; e.g., at least one random-access memory, at least one flash memory, at least one read-only memory (ROM) (e.g., at least one electrically erasable programmable read-only memory (EEPROM)), at least one on-processor memory (e.g., at least one on-processor cache, at least one on-processor buffer, at least one on-processor flash memory, at least one on-processor EEPROM, or a combination thereof), or a combination thereof), at least one storage device (e.g., at least one hard-disk drive, at least one tape drive, at least one solid-state drive, at least one flash drive, at least one readable and/or writable disk of at least one optical drive configured to read from and/or write to the at least one readable and/or writable disk, or a combination thereof), or a combination thereof).

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more. Further, as used throughout, "zero or more" means zero, one, or a plurality of; for example, "zero or more" may comprise zero, one, two, three, . . . , one hundred, or more.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A touchscreen display, comprising:
a display chassis;
a touchscreen sensor comprising a grid of row conductors and column conductors spanning a display surface of the touchscreen display; and
a plurality of filters, each of the plurality of filters coupled to one of the row conductors or the column conductors such that the row conductors and the column conductors are coupled to the plurality of filters,
each of the plurality of filters grounded to the display chassis near an edge of the display surface,
each of the plurality of filters configured to allow a touchscreen sensor frequency band of interest to pass through said filter such that the touchscreen sensor is configured to detect touches,
each of the plurality of filters configured to filter out electromagnetic interference (EMI) on frequencies other than the touchscreen sensor frequency band of interest and to ground the EMI to the display chassis by ac coupling the frequencies other than the touchscreen sensor frequency band of interest to the display chassis near the edge of the display surface,
wherein the touchscreen sensor and the plurality of filters form an EMI shield across the display surface of the touchscreen display,
wherein the touchscreen display lacks a transparent conductive layer applied across the display surface spanning the display surface of the touchscreen display,
wherein touchscreen display is an aircraft touchscreen display,
wherein each of the plurality of filters is a band pass filter configured to filter out the EMI on frequencies above and below the touchscreen sensor frequency band of interest.

2. The touchscreen display of claim 1, wherein each of the plurality of filters is coupled to an end of one of the row conductors or the column conductors such that ends of the row conductors and the column conductors are coupled to the plurality of filters.

3. The touchscreen display of claim 1, wherein touchscreen display is a projected capacitance touchscreen display and the touchscreen sensor is a projected capacitance touchscreen sensor.

4. The touchscreen display of claim 1, wherein touchscreen display is a resistive touchscreen display and the touchscreen sensor is a resistive touchscreen sensor.

5. The touchscreen display of claim 1, wherein each of the plurality of filters are resistance capacitance (RC) filters.

6. The touchscreen display of claim 1, wherein each of the plurality of filters are passive filters.

7. The touchscreen display of claim 1, wherein each of the plurality of filters are active filters.

8. The touchscreen display of claim 1, wherein touchscreen display is an emissive touchscreen display.

9. The touchscreen display of claim 1, wherein touchscreen display is a transmissive touchscreen display.

10. The touchscreen display of claim 1, wherein the touchscreen display lacks a non-grid indium tin oxide (ITO) layer applied across the display surface spanning the display surface of the touchscreen display.

11. A projected capacitance touchscreen display, comprising:
a display chassis;
a touchscreen sensor comprising a grid of row conductors and column conductors spanning a display surface of the touchscreen display, wherein each intersection of the row conductors and column conductors forms a capacitor;
a plurality of drivers coupled to each of a first set of conductors, the first set of conductors being either the row conductors or the column conductors, the plurality of drivers configured to drive a transmit signal through each of the first set of conductors;
a plurality of receivers coupled to each of a second set of conductors, the second set of conductors being other than the row conductors or the column conductors coupled to the plurality of drivers, the plurality of receivers configured to receive a receive signal from each of the second set of conductors; and
a plurality of filters, each of the plurality of filters coupled to one of the row conductors or the column conductors such that the row conductors and the column conductors are coupled to the plurality of filters,
each of the plurality of filters grounded to the display chassis near an edge of the display surface,
each of the plurality of filters configured to allow a touchscreen sensor frequency band of interest to pass through said filter such that the touchscreen sensor is configured to detect touches,
each of the plurality of filters configured to filter out electromagnetic interference (EMI) on frequencies other than the touchscreen sensor frequency band of interest and to ground the EMI to the display chassis by ac coupling the frequencies other than the touchscreen sensor frequency band of interest to the display chassis near the edge of the display surface,
wherein the touchscreen sensor and the plurality of filters form an EMI shield across the display surface of the touchscreen display,
wherein the touchscreen display lacks a transparent conductive layer applied across the display surface spanning the display surface of the touchscreen display,
wherein touchscreen display is an aircraft touchscreen display,
wherein each of the plurality of filters is a band pass filter configured to filter out the EMI on frequencies above and below the touchscreen sensor frequency band of interest.

12. The projected capacitance touchscreen display of claim 11, wherein each of the plurality of filters is coupled to an end of one of the row conductors or the column conductors such that ends of the row conductors and the column conductors are coupled to the plurality of filters.

13. A resistive touchscreen display, comprising:
a display chassis;
a touchscreen sensor comprising a grid of row conductors and column conductors spanning a display surface of the touchscreen display, the grid of row conductors and column conductors forming a plurality of resistive touchscreen sensor cells; and
a plurality of filters, each of the plurality of filters coupled to one of the row conductors or the column conductors such that the row conductors and the column conductors are coupled to the plurality of filters,
each of the plurality of filters grounded to the display chassis near an edge of the display surface,
each of the plurality of filters configured to allow a touchscreen sensor frequency band of interest to pass through said filter such that the touchscreen sensor is configured to detect touches,
each of the plurality of filters configured to filter out electromagnetic interference (EMI) on frequencies other than the touchscreen sensor frequency band of interest and to ground the EMI to the display chassis by ac coupling the frequencies other than the touchscreen sensor frequency band of interest to the display chassis near the edge of the display surface,
wherein the touchscreen sensor and the plurality of filters form an EMI shield across the display surface of the touchscreen display,
wherein the touchscreen display lacks a transparent conductive layer applied across the display surface spanning the display surface of the touchscreen display,
wherein touchscreen display is an aircraft touchscreen display,
wherein each of the plurality of filters is a band pass filter configured to filter out the EMI on frequencies above and below the touchscreen sensor frequency sensor frequency band of interest.

14. The resistive touchscreen display touchscreen display of claim 13, wherein each of the plurality of filters is coupled to an end of one of the row conductors or the column conductors such that ends of the row conductors and the column conductors are coupled to the plurality of filters.

* * * * *